(12) United States Patent
Chen et al.

(10) Patent No.: US 6,207,972 B1
(45) Date of Patent: Mar. 27, 2001

(54) LIGHT EMITTING DIODE WITH TRANSPARENT WINDOW LAYER

(75) Inventors: Jyh-Chia Chen, Ellicott; Zhenchun Huang, Clarksville; Li-Hsin Kuo, Columbia, all of MD (US)

(73) Assignee: Super Epitaxial Products, Inc., Columbia, MD (US)

( * ) Notice: Subject to any disclaimer, the term of this patent is extended or adjusted under 35 U.S.C. 154(b) by 0 days.

(21) Appl. No.: 09/228,426

(22) Filed: Jan. 12, 1999

(51) Int. Cl.$^7$ .................................................. H01L 33/00
(52) U.S. Cl. .............................. 257/94; 257/96; 257/97; 257/101; 438/46; 438/47
(58) Field of Search .................. 257/94, 96, 97, 257/101, 99; 438/46, 47

(56) References Cited

U.S. PATENT DOCUMENTS

| Re. 35,665 | * | 11/1997 | Lin et al. ................... | 257/94 |
|---|---|---|---|---|
| 5,233,204 | | 8/1993 | Fletcher et al. ............ | 257/13 |
| 5,565,694 | * | 10/1996 | Huang et al. .............. | 257/97 |
| 5,869,849 | * | 2/1999 | Jou et al. ................... | 257/96 |
| 6,040,588 | * | 3/2000 | Koide et al. ............... | 257/15 |
| 6,046,464 | * | 4/2000 | Schetzina ................... | 257/96 |
| 6,057,562 | * | 5/2000 | Lee et al. ................... | 257/96 |
| 6,057,563 | * | 5/2000 | Chen et al. ................. | 257/97 |

FOREIGN PATENT DOCUMENTS

| 410256599 | * | 9/1998 | (JP) . |
| 411017218 | * | 1/1999 | (JP) . |

OTHER PUBLICATIONS

"Novel Type of ZnO Studied in Combination with 1.5eV a–SiGe:H PIN Diodes", H.C. Weller et al., IEEE. CH2953–Aug. 1991, pp. 1290–1295.

"Textured ZnO:A1 Films for Solar Cells by DC–Magnetron Sputtering in Water Vapor Plasma", T. Nakada et al., IEEE, CH2953–Aug. 1991, pp. 1389–1392.

* cited by examiner

Primary Examiner—William Mintel
(74) Attorney, Agent, or Firm—McDermott, Will & Emery

(57) ABSTRACT

The light brightness of a semiconductor LED is increased by employing a light transmitting window comprising ZnO. In another embodiment, current crowding is reduced, efficiency increased and reliability (lifetime) increased by forming a thin semiconductor transition layer to reduce contact resistance between an overlying transparent window layer and an underlying transparent current diffusion layer formed on a double heterostructure light generation region. Optimum performance is achieved employing the transition layer with a ZnO transparent window layer.

15 Claims, 3 Drawing Sheets

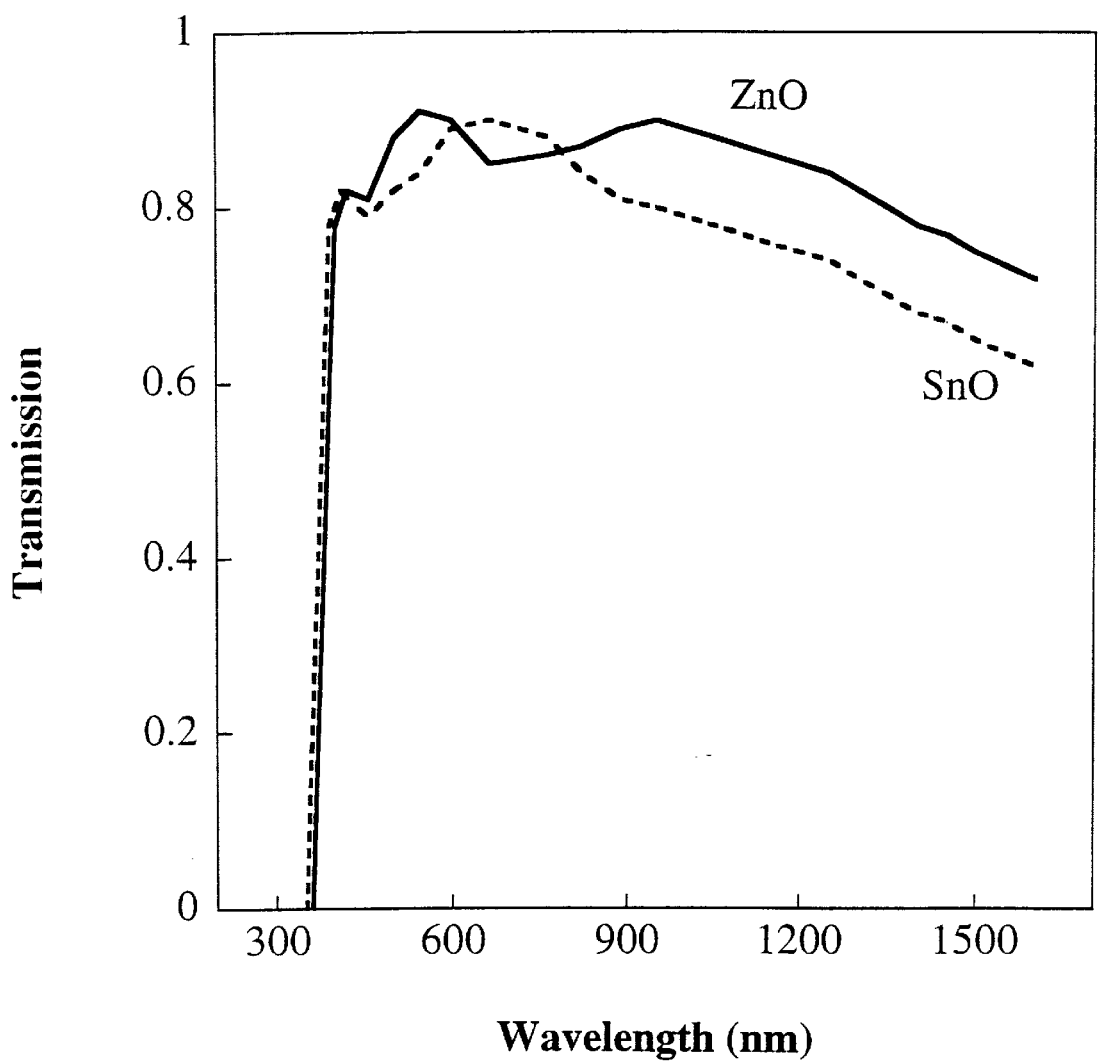
Fig.5 Transmission spectrum for ZnO and SnO.

LIGHT EMITTING DIODE WITH TRANSPARENT WINDOW LAYER

TECHNICAL FIELD

The present invention relates to a semiconductor light emitting diode (LED). The present invention is particularly applicable to a semiconductor LED having high efficiency and reliability and comprising a heterostructure light generating region and a transparent window layer.

BACKGROUND ART

Conventional LEDs comprise a semiconductor light generation region on a light absorbing substrate. Such LEDs enjoy various industrial applications, as in optical communication systems, optical information processing and as a light source due to their low power consumption, efficiency and reliability. Efficient operation of an LED requires uniform lateral spreading of current injected by a front electrical contact, so that the current uniformly enters the light generation region, thereby generating light with uniformity. However, as a result of current crowding, current tends to concentrate under the front electrical contact, thereby preventing uniform light generation. Industry efforts have focused upon reducing the current crowding problem as well as increasing the brightness of emitted light.

A traditional semiconductor LED is schematically illustrated in FIG. 1 and comprises a back electrical contact 10, an n-type substrate 20, a double heterostructure 30 (light generation region) which includes an undoped active layer 3b positioned between doped confinement layers 3a and 3c, and a front contact 70. It is in such a structure that current crowding typically occurs between the light generation region 30 and front contact 70, thereby preventing uniform light generation.

A prior effort to alleviate the current crowding effect and maximize light output is disclosed by Fletcher et al. in U.S. Pat. No. 5,233,204 and schematically illustrated in FIG. 2, wherein elements similar to those depicted in FIG. 1 bear similar reference numerals and, hence, are not described in detail to avoid repetition. The improvement disclosed by Fletcher et al. comprises positioning a relatively thick transparent semiconductor window layer 40, e.g., about 10 microns to about 50 microns, between the light generation region 30 and the front metal contact 70. Window layer 40 is desirably selected from materials having a high conductivity to enable rapid current spreading from front contact 70, thereby minimizing the current crowding effect. In addition, window layer 40 should have a higher bandgap than that of the light generation region 30 so that window layer 40 is transparent to emitted light. There are, however, drawbacks attendant upon the semiconductor LED illustrated in FIG. 2. For example, semiconductor window layer 40 can not include material systems having lattice constants which are not compatible with light generation region 30, thereby limiting design flexibility. In addition, the growth of a thick layer is time consuming.

Another prior approach to the current crowding problem is disclosed by Lin et al. in U.S. Pat. No. Re. 35,665 and schematically illustrated in FIG. 3, wherein elements similar to those in FIGS. 1 and 2 bear similar reference numerals. The semiconductor LED illustrated in FIG. 3 basically differs from that of FIG. 2 in that the thick semiconductor window layer 40 (FIG. 2) is replaced by transparent conductive oxide window layer 50 and an ohmic contact layer 51 which is typically a semiconductor material having a relatively high impurity concentration, e.g., greater than about $1 \times 10^{18}$ atoms $cm^{-3}$. Ohmic contact layer 51 is provided so that window layer 50 can be formed on a p-type confinement layer (3c), thereby expanding utility to n-type gallium-arsenide (GaAs) substrate-based LEDs. The transparent conductive oxide 50 comprises tin oxide, indium oxide, or indium-tin oxide, which are conductive materials, relatively inexpensive and relatively easier to grow than semiconductor compound transparent window materials for window layer 40 (FIG. 2).

With continued reference to FIG. 3, the utilization of a transparent conductive oxide layer 50 could reduce the current crowding effect, reduce manufacturing time, improve efficiency and expand applicability to LEDs with n-type GaAs substrates. Such oxides are suitable window materials for LEDs employing aluminum-gallium-indium-phosphorous (AlGaInP) material systems, i.e. for the light generation region, which emit light having wavelengths ranging from about 570 to about 680 nm. However, semiconductor LEDs based upon FIG. 3 are also problematic. For example, tin oxide, indium oxide and indium tin oxide exhibit poor optical transmission at longer wavelengths and, hence, are not particularly suitable for use in semiconductor LEDs at wavelengths of about 1.3 or about 1.5 $\mu m$. Such oxides are also toxic, and do not exhibit long term chemical stability. In addition, semiconductor LEDs based upon FIG. 3 exhibit an undesirably high contact resistance between light transmission region 30 and ohmic contact layer 51, which unnecessarily squanders electricity and increases the operating temperature, e.g., above room temperature, thereby decreasing device reliability, i.e. longevity.

There exists a need for a semiconductor LED which exhibits improved light brightness, reduced crowding effect and increased longevity. There also exists a need for such a semiconductor LED which can be manufactured efficiently and economically.

DISCLOSURE OF THE INVENTION

An advantage of the present invention is a semiconductor LED exhibiting improved light brightness and reduced current crowding.

Another advantage of the present invention is a semiconductor LED exhibiting long term stability and reduced toxicity.

A further advantage of the present invention is a semiconductor LED exhibiting improved light brightness, reduced current crowding, long term stability and reduced toxicity which can be manufactured economically and efficiently.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor LED comprising: a semiconductor substrate having a back electrode contact; a light generation region on the substrate; a transparent current diffusion layer on the light generation region; a dual transparent layer window on the current diffusion layer; and a front contact on the dual layer window.

Embodiments of the present invention include a dual layer window comprising a transition layer on the current diffusion layer and a transparent window layer on the transition layer, wherein the transition layer has a bandgap selected to reduce contact resistance between the current diffusion layer and the window layer. Embodiments of the present invention include forming the transition layer at a thickness of about 10 to about 100 nm and forming the window layer at a thickness of about 0.5 micron to about 2 microns. Embodiments of the present invention also include forming the transition layer of a doped semiconductor material, and employing a highly doped semiconductor material as the current diffusion layer at a thickness of about 5 microns to about 10 microns.

Another aspect of the present invention is a semiconductor LED comprising: a semiconductor substrate having a back electrical contact; a light generation region on substrate; a transparent window layer comprising zinc oxide; and a front contact on the window layer.

Embodiments of the present invention include forming a highly doped transparent current diffusion layer on a double heterostructure light generation region and forming a doped semiconductor transition layer between the zinc oxide window layer and current diffusion layer, such that the transition layer reduces contact resistance between the current diffusion layer and window layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

FIG. 5 shows the optical transmission of zinc oxide and tin oxide.

DESCRIPTION OF THE INVENTION

The present invention addresses and solves the current crowding problem in semiconductor LEDs, thereby enhancing efficiency and increasing the brightness of emitted light. Embodiments of the present invention additionally comprise increasing the reliability or lifetime of a semiconductor LED.

In accordance with embodiments of the present invention, the brightness of emitted light of a semiconductor LED is improved by strategically employing zinc oxide in forming the transparent window. It was found that zinc oxide results in improved efficiency in terms of power output and brightness.

Zinc oxide has been mentioned as a suitable material for use in solar cells. See, Weller et al., "NOVEL TYPE OF ZnO STUDIED IN COMBINATION WITH 1.5 eV A —SiGeiHPIN DIODES", IEEE, CH2953-8/91, pages 1290–1295 and Nakada et al., "TEXTURED ZnO:AL FILMS FOR SOLAR CELLS BY DC-MAGNETRON SPUTTERING IN WATER VAPOR PLASMA", IEEE, CH2953-8/91, pages 1389–1392. Solar cells are structurally and functionally different, of course, from semiconductor LEDs. Basically, semiconductor LED devices consume electricity and emit light. However, solar cells operate in the reverse manner, i.e. solar cells absorb and generate electricity from the absorbed light. Since solar cells operate at about room temperature, reliability is not an issue.

Reliability of the semiconductor LEDs is a problem, however, particularly upon degradation of the material employed in a conventional window, e.g. tin oxide, indium oxide or indium tin oxide. The degradation of such material causes the semiconductor LED to run at a high temperature thereby shortening its lifetime.

Figure 2:
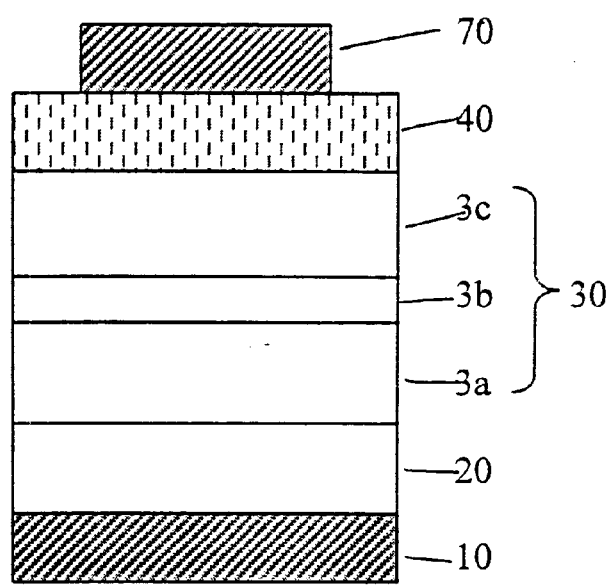
FIG. 2 schematically illustrates a cross-sectional view of another conventional semiconductor LED.
Figure 3:
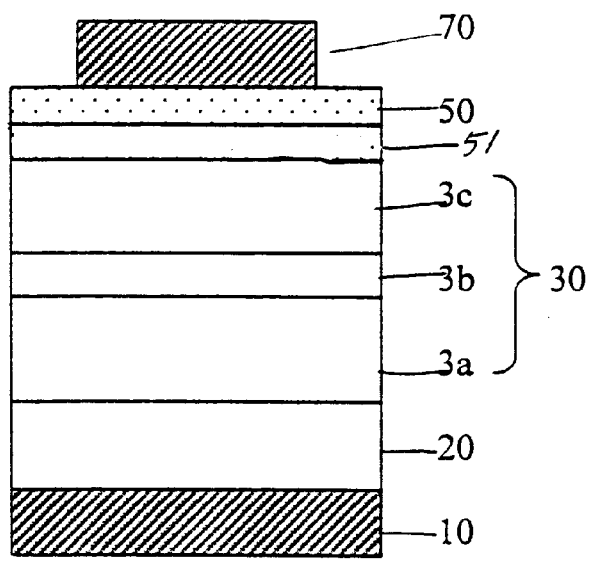
FIG. 3 schematically illustrates a cross-sectional view of another conventional semiconductor LED.

In accordance with an embodiment of the present invention, a window layer, such as window layer 40 of the FIG. 2 device, or window layer 50 of the FIG. 3 device, is fabricated of zinc oxide, thereby significantly enhancing the brightness of emitted light and further significantly enhancing reliability.

A comparison of the optical transmission of zinc oxide vis-à-vis tin oxide is shown in FIG. 5. It is apparent that zinc oxide exhibits a higher optical transmission than tin oxide, (as well as indium oxide and indium tin oxide,) in the wavelength region of about 370 to about 1700 nm. Thus, zinc oxide is a strategically desirable material for use as a window layer for semiconductor LEDs emitting light ranging from about 370 to about 1700 nm.

In another embodiment of the present invention, a semiconductor LED is formed with a thin dual layer window comprising a transition layer between an overlying transparent window layer and an underlying current diffusion layer. The thin transition layer is strategically formed of a material to reduce contact resistance between the window layer and current diffusion layer, thereby reducing the amount of electricity consumed and, hence, avoiding an increase in operating temperature so that the lifetime of the semiconductor LED is increased. In embodiments of the present invention, the thin transition layer is formed of a material having a bandgap which is different from the bandgap of the overlying window layer and different from the bandgap of the underlying current diffusion layer. Embodiments of the present invention include forming the thin transition layer of a material having a bandgap which is less than the bandgap of the overlying transparent window layer and less than the bandgap of the underlying diffusion layer.

Embodiments of the present include forming the transition layer at a thickness of about 10 to about 100 nm, e.g. at a thickness of about 50 to about 100 nm. Embodiments of the present invention also include forming the transparent window layer at a thickness of about 0.05 microns to about 2 microns, e.g. about 0.1 micron to about 0.2 micron.

Suitable materials for the transition layer include any of various semiconductor materials, such as indium-gallium-arsenic (InGaAs), gallium-arsenide (GaAs) and indium-galium-arsenic-phosphorus (InGaAsP). Embodiments of the present invention also include forming the thin transition layer of a semiconductor material having an impurity concentration of about $5 \times 10^{17}$ atoms $cm^{-3}$ to about $4 \times 10^{19}$ atoms $cm^{-3}$.

In embodiments of the present invention comprising the use of a thin transition layer to reduce contact resistance, the window layer can comprise tin oxide, indium oxide, indium-tin-oxide or, preferably, zinc oxide for enhanced brightness.

In accordance with embodiments of the present invention, a current diffusion layer is provided on the light generation region and the transition layer is formed on the current diffusion layer. The current diffusion layer is typically formed at a thickness of about 5 microns to about 10 microns and typically comprises a semiconductor material, such as AlGaAs, gallium-arsenic-phosphorus (GaAsP), and/or gallium-phosphorus (GaP), with a high impurity concentration, such as about $5.0 \times 10^{17}$ atoms cm$^{-3}$ to about $4.0 \times 10^{18}$ atoms cm$^{-3}$.

Figure 1:
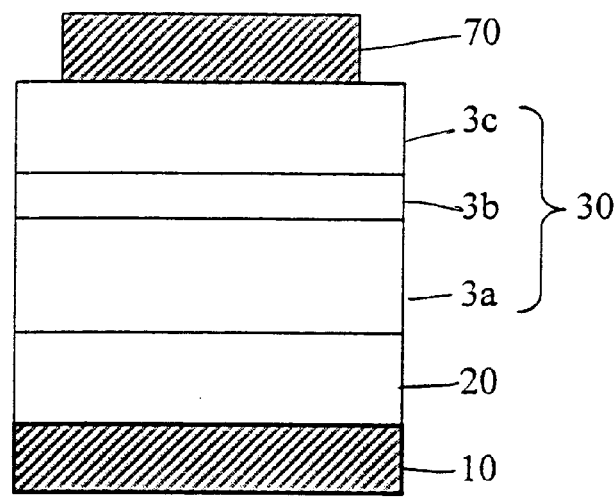
FIG. 1 schematically illustrates a cross-sectional view of a conventional semiconductor LED.
Figure 4:
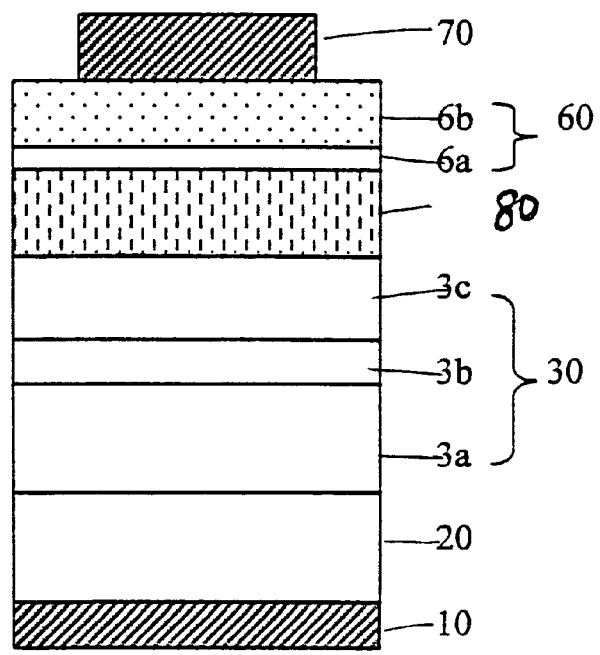
FIG. 4 schematically illustrates a cross-sectional view of a semiconductor LED in accordance with an embodiment of the present invention.

An embodiment of the present invention is illustrated in FIG. 4 wherein elements similar to those in FIGS. 1–3 bear similar reference numerals. The semiconductor LED illustrated in FIG. 4 comprises back electrical contact 10 and semiconductor substrate 20, such as n-type or p-type InP or GaAs. A light generation region 30 is provided on substrate 20. Light generation region 30 typically comprises a conventional double heterostructure of an AlGaInP, AlGaAs or InGaAsP material system forming a PN junction. For example, layer 3a can comprise an n-type semiconductor material, layer 3b an undoped semiconductor material and layer 3c a semiconductor material containing a p-type dopant. Suitable n-type dopants include silicon and selenium. Suitable p-type dopants include magnesium, zinc and carbon.

In the embodiment depicted in FIG. 4, a relatively thick current diffusion layer 80 is formed on light generation region 30. Current diffusion layer 80 serves to reduce current crowding and is typically formed of a transparent semiconductor material which is heavily doped. Current diffusion layer 80 can be formed at a thickness of about 5 microns to about 10 microns of AlGaAs, InP or GaP and typically has an impurity concentration of about $5 \times 10^{17}$ to about $4 \times 10^{18}$ atoms cm$^{-3}$. For example, current diffusion layer 80 can comprise a highly doped Al$_x$Ga$_{1-x}$As(x=0.6–0.8) with an impurity concentration of at least about $1 \times 10^{18}$ cm$^{-3}$.

The transparent dual layer window 60 is then formed on current diffusion layer 80. Transparent dual layer window 60 comprises a thin transition layer 6a and a relatively thick conductive oxide window layer 6b, preferably zinc oxide. Thin transition layer 6a is typically formed of a material having a narrower bandgap than that of current diffusion layer 80 and capable of being heavily doped with both n-type and p-type impurities. For example, transition layer 6a can be formed at a thickness of about 500 Å of In$_x$Ga$_{1-x}$As (x=0.5) with an impurity concentration of about $5 \times 10^{17}$ to about $4 \times 10^{19}$ atoms cm$^{-3}$. Front contact 70 is then formed on transparent window layer 6b. All layers can be formed or grown by conventional techniques.

Semiconductor LEDs in accordance with embodiments of the present invention can be employed for emitting light at various wavelengths. An (Al$_x$Ga$_{1-x}$)$_{0.5}$In$_{0.5}$P system can be employed for light generation region 30 in manufacturing semiconductor LEDs emitting light at wavelengths ranging from 565 to 620 nm. For example, when x=0.4, the semiconductor LED emits light at 565 nm. An n-type GaAs material with an impurity concentration of about $2 \times 10^{17}$ atoms cm$^{-3}$ to $4 \times 10^{18}$ atoms cm$^{-3}$ can be employed as substrate 20. Light generation region 30 can comprise a 1 micron thick n-type (Al$_x$Ga$_{1-x}$)$_{0.5}$In$_{0.5}$P layer 3a formed on the GaAs substrate. A 0.5 micron-thick undoped (Al$_x$Ga$_{1-x}$)$_{0.5}$In$_{0.5}$P layer 3b is grown on layer 3a and a 1 micron-thick p-type (Al$_x$Ga$_{1-x}$)$_{0.5}$In$_{0.5}$P layer 3c formed on layer 3b. A 5–10 micron-thick highly doped GaP current diffusion layer 80 is then grown on light generation region 30. A 50–100 nm-thick In$_x$Ga$_{1-x}$As(x=0.5) transition layer 6a is then grown on current diffusion layer 80 to reduce contact resistance. It was found that such a heavily doped p-type narrow bandgap thin In$_x$Ga$_{1-x}$As layer, with a carrier concentration of about $5 \times 10^{17}$ to $4 \times 10^{19}$ atoms cm$^{-3}$ advantageously reduces the current crowding effect without adversely affecting light output.

A 0.2 micron-thick zinc oxide layer is then formed as the transparent conducting oxide layer 6b on top of layer 6b. The zinc oxide is advantageous in various respects. For example, zinc oxide is non toxic, chemically stable and can be deposited at a relatively low cost. In addition, zinc oxide exhibits higher optical transmission than tin oxide, indium oxide and indium-tin oxide, in the wavelength region of about 370 to 1700 nm.

Embodiments of the present invention also encompass semiconductor LEDs emitting light at about 650 nm employing an Al$_x$Ga$_{1-x}$As material system for the light generation region 30. For example, adverting to FIG. 4, light generation region 30 can comprise a 1 micron-thick n-type Al$_{0.6}$Ga$_{0.4}$As layer 3a on an n-type GaAs substrate. A 0.5 micron-thick undoped AlGaAs layer 3b is formed on 3a, and a 1 micron-thick p-type Al$_{0.6}$Ga$_{0.4}$As layer 3c is formed on 3b. A 5–10 micron-thick highly doped Al$_x$Ga$_{1-x}$As (x=0.6–0.8) current diffusion layer 80 is formed on layer 3c. A 50–100 nm-thick highly doped p-type In$_x$Ga$_{1-x}$As (x=0.5) transition layer 6a is grown on top of current diffusion layer 80. A 2 micron-thick zinc oxide window layer 6b is then formed on transition layer 6a. By selecting "x" as 0.6, the resulting semiconductor LED would emit light at a wavelength of about 620 nm.

Embodiments of the present invention also include semiconductor LEDs emitting light at relatively long wavelengths, such as 1.3 or 1.5 micron, employing an InGaAsP-InP material system for light generation region 30. For example, adverting to FIG. 4, substrate 20 comprises n-type InP with an impurity concentration of about $5 \times 10^{17}$ to about $3 \times 10^{18}$ atoms Cm$^{-3}$. The light generation region 30 formed on substrate 20 includes a 1 micron-thick n-type InP layer 3a, a 0.2 micron-thick InGaAsP layer 3b as the active layer on 3a, and a 1 micron-thick p-type InP layer 3c on active layer 3b. A 5–10 micron-thick highly doped p-type InP layer is grown as the current diffusion layer 80 on layer 3c. Subsequently, a 50–100 nm-thick In$_{0.5}$Ga$_{0.5}$As transition layer 6a is formed on current diffusion layer 80. A 0.2 micron-thick zinc oxide layer is then grown on the transition layer 6a, and contact layer 70 is formed thereon.

Thus, the present invention advantageously enables the formation of semiconductor LEDs which exhibit significantly reduced current crowding and high efficiency together with significantly enhanced brightness and longevity. Semiconductor LEDs in accordance with embodiments of the present invention enjoy applicability in various technological industries, including optical communication, optical information processing, and as a light source. Semiconductor LEDs in accordance with embodiments of the present invention can be fabricated employing conventional equipment and techniques, to manipulate various wavelengths depending upon the particular semiconductor material system selected.

In the previous description, numerous specific details are set forth, such as specific materials, structures, thicknesses, dopant concentrations, etc., to provide a better understanding of the present invention. However, the present invention can be practiced without resulting to the details specifically set forth. In other instances, well known processing materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments, and is capable of changes and modifications within the scope of the inventive concept as expressed herein.

What is claimed is:

1. A semiconductor light emitting diode (LED) comprising:
   a semiconductor substrate having a back electrical contact;
   a light generation region on the substrate;
   a transparent current diffusion layer on the light generation region;
   a dual layer window on the current diffusion layer; and
   a front contact on the dual layer window, wherein the dual layer window comprises:
      a thin transition layer on the current diffusion layer; and
      a transparent window layer, comprising zinc oxide, on the transition layer, the transition layer reducing contact resistance between the current diffusion layer and the window layer.

2. The semiconductor LED according to claim 1, wherein the light generation region comprises a double heterostructure.

3. The semiconductor LED according to claim 1, wherein the transition layer has a bandgap less than that of the window layer and less than that of the current diffusion layer.

4. The semiconductor LED according to claim 1, wherein the transition layer comprises a semiconductor material.

5. The semiconductor LED according to claim 4, wherein the transition layer comprises a semiconductor material selected from the group consisting of InCaAs, GaAs and InGaAsP.

6. The semiconductor LED according to claim 1, wherein the transition layer has a thickness of about 10 to about 100 nm.

7. The semiconductor LED according to claim 1, wherein the window layer has a thickness of about 0.05 micron to about 2 microns.

8. The semiconductor LED according to claim 5, wherein the semiconductor material has an impurity concentration of about $5 \times 10^{17}$ atoms $cm^{-3}$ to about $4 \times 10^{19}$ atoms $cm^{-3}$.

9. The semiconductor LED according to claim 1, wherein the current diffusion layer has a thickness of about 5 microns to about 10 microns.

10. The semiconductor LED according to claim 9, wherein the current diffusion layer comprises a semiconductor material.

11. The semiconductor LED according to claim 10, wherein the current diffusion layer comprises a semiconductor material selected from the group consisting of AlGaAs, InP, GaAsP, AlGaP and GaP.

12. The semiconductor LED according to claim 11, wherein the current diffusion layer comprises a p-type dopant selected from the group of magnesium, zinc and carbon.

13. The semiconductor LED according to claim 10, wherein the semiconductor material has an impurity concentration of about $5 \times 10^{17}$ atoms $cm^{-3}$ to about $5 \times 10^{18}$ $cm^{-3}$.

14. The semiconductor LED according to claim 2, wherein the light generation region comprises a double heterostructure containing:
   a semiconductor layer of a first conductivity type on the substrate;
   an undoped semiconductor layer on the semiconductor layer of the first conductivity type; and
   a semiconductor layer of the second conductivity type, opposite the first conductivity type, on the undoped semiconductor layer.

15. The semiconductor LED according to claim 14, wherein the double heterostructure comprises a semiconductor material selected from the group of AlGaInP, AlGaAs and InGaAsP material systems.

* * * * *